US012683098B2

(12) United States Patent
Ting et al.

(10) Patent No.: US 12,683,098 B2
(45) Date of Patent: Jul. 14, 2026

(54) KEY MODULE AND KEYBOARD

(71) Applicant: WISTRON CORP., New Taipei City (TW)

(72) Inventors: Shih Ting Ting, New Taipei City (TW); Yuyin Liu, New Taipei City (TW); Zi-Feng Huang, New Taipei City (TW); Zhi-Yang Xian, New Taipei City (TW); Yulun Chiang, New Taipei City (TW)

(73) Assignee: WISTRON CORP., New Taipei City (TW)

( * ) Notice: Subject to any disclaimer, the term of this patent is extended or adjusted under 35 U.S.C. 154(b) by 404 days.

(21) Appl. No.: 18/359,010

(22) Filed: Jul. 26, 2023

(65) Prior Publication Data

US 2024/0355557 A1     Oct. 24, 2024

(30) Foreign Application Priority Data

Apr. 21, 2023    (CN) .......................... 202310440442.7

(51) Int. Cl.
| | |
|---|---|
| *H01H 13/02* | (2006.01) |
| *H01H 13/14* | (2006.01) |
| *H01H 13/83* | (2006.01) |
| *H01R 12/79* | (2011.01) |
| *H05K 1/18* | (2026.01) |

(52) U.S. Cl.
CPC .......... *H01H 13/023* (2013.01); *H01H 13/14* (2013.01); *H01H 13/83* (2013.01); *H05K 1/18* (2013.01); *H01H 2219/016* (2013.01); *H01H 2219/037* (2013.01); *H01H 2219/04* (2013.01); *H01H 2219/046* (2013.01); *H01R 12/79* (2013.01); *H05K 2201/09072* (2013.01); *H05K*
*2201/10053* (2013.01); *H05K 2201/10128* (2013.01); *H05K 2201/10189* (2013.01);
(Continued)

(58) Field of Classification Search
CPC ........... H05K 2201/09072; H05K 1/18; H01R 12/79; H01H 2219/016; H01H 2219/037; H01H 2219/04; H01H 2219/046; H01H 3/023; H01H 3/14; H01H 3/83; H01H 13/14; H01H 13/02; H01H 13/83
USPC ......................................................... 200/5 A
See application file for complete search history.

(56) References Cited

U.S. PATENT DOCUMENTS

| | | | | |
|---|---|---|---|---|
| 7,129,930 B1 * | 10/2006 | Cathey | ................... | H01H 13/83 |
| | | | | 345/169 |
| 7,583,512 B2 * | 9/2009 | Ryu | ....................... | H05K 1/185 |
| | | | | 361/795 |

(Continued)

FOREIGN PATENT DOCUMENTS

TW          I657470 B      4/2019

OTHER PUBLICATIONS

TW Office Action dated Oct. 31, 2023 in Taiwan application No. 112117310.

*Primary Examiner* — Anthony R Jimenez
(74) *Attorney, Agent, or Firm* — McClure, Qualey & Rodack, LLP

(57) ABSTRACT

A key module includes a circuit assembly, a support assembly and a display assembly. The support assembly is movably disposed on the circuit assembly. The display assembly includes a digital display unit. The digital display unit is supported on the circuit assembly by the support assembly, and the digital display unit is electrically connected to the circuit assembly.

13 Claims, 11 Drawing Sheets

(52) U.S. Cl.
CPC .............. *H05K 2201/10537* (2013.01); *H05K 2201/10545* (2013.01)

(56)                     References Cited

U.S. PATENT DOCUMENTS

| | | | | |
|---|---|---|---|---|
| 10,592,004 B1 * | 3/2020 | Sun | ........................ | H01H 13/83 |
| 2010/0188329 A1 * | 7/2010 | Lorenzo Riera | ..... | H01H 13/023 |
| | | | | 345/156 |
| 2020/0089330 A1 | 3/2020 | Sun | | |

* cited by examiner

20

21

23

22

KEY MODULE AND KEYBOARD

CROSS-REFERENCE TO RELATED APPLICATIONS

This non-provisional application claims priority under 35 U.S.C. § 119(a) on Patent Application No(s). 202310440442.7 filed in China on Apr. 21, 2023, the entire contents of which are hereby incorporated by reference.

TECHNICAL FIELD

The disclosure relates to a key module and a keyboard, more particularly to a key module having a display assembly and a keyboard including the key module.

BACKGROUND

In general, a keyboard consists of a plurality of keys, and a keycap of each key has a character coated or sprayed thereon to be recognized by a user. Since different languages are used in different countries, keyboard manufacturers will produce keyboards with corresponding characters according to the languages used in different countries.

However, the keycaps with characters from different languages shouldn't be mixed on the same keyboard, and thus the keycaps have poor versatility. In addition, during the production of a keyboard intended for a specific language, there is a risk that keycaps with characters from different languages may be mixed and installed on the keyboard. Furthermore, during the replacement of keycaps, it is necessary to specify the use of keycaps with characters from a specific language. As a result, the cost of keyboard production and maintenance is difficult to be reduced.

On the other hand, since the characters on the keycaps are formed through processes such as coating or spraying, users cannot change the characters on the keycaps at will while using the keyboards, and thus the arrangement of the characters of the keycaps cannot be adjusted.

SUMMARY

The disclosure provides a key module and a keyboard which reduce the cost of keyboard production and maintenance and enable the arrangement of the characters of the keyboard to be adjusted according to actual requirements.

One embodiment of the disclosure provides a key module. The key module includes a circuit assembly, a support assembly and a display assembly. The support assembly is movably disposed on the circuit assembly. The display assembly includes a digital display unit. The digital display unit is supported on the circuit assembly by the support assembly, and the digital display unit is electrically connected to the circuit assembly.

Another embodiment of the disclosure provides a keyboard. The keyboard includes a casing and a plurality of key modules. The key modules are disposed on the casing, and each of the key modules includes a circuit assembly, a support assembly and a display assembly. The support assembly is movably disposed on the circuit assembly. The display assembly includes a digital display unit. The digital display unit is supported on the circuit assembly by the support assembly, and the digital display unit is electrically connected to the circuit assembly.

Still another embodiment of the disclosure provides a key module. The key module is configured to be disposed on a casing. The key module includes a key main body and a digital display unit. The key main body is configured to be disposed on the casing. The key main body includes a support assembly, and the key main body is movable relative to the casing via the support assembly. The digital display unit is disposed on the key main body.

According to the key modules and the keyboard as discussed in the above embodiments, each of the key modules includes the digital display unit for displaying the digital image, so that the key modules may display characters of different languages according to actual requirements, and thus the key modules may be applied in the keyboard of different languages, thereby reducing the cost of the production and maintenance of the keyboard. In addition, the characters displayed by the digital display units of the key modules of the keyboard can be switched according to actual requirements, and thus the arrangement of the characters of the keyboard can be adjusted.

BRIEF DESCRIPTION OF THE DRAWINGS

The present disclosure will become better understood from the detailed description given herein below and the accompanying drawings which are given by way of illustration only and thus are not intending to limit the present disclosure and wherein.

DETAILED DESCRIPTION

Figure 1:
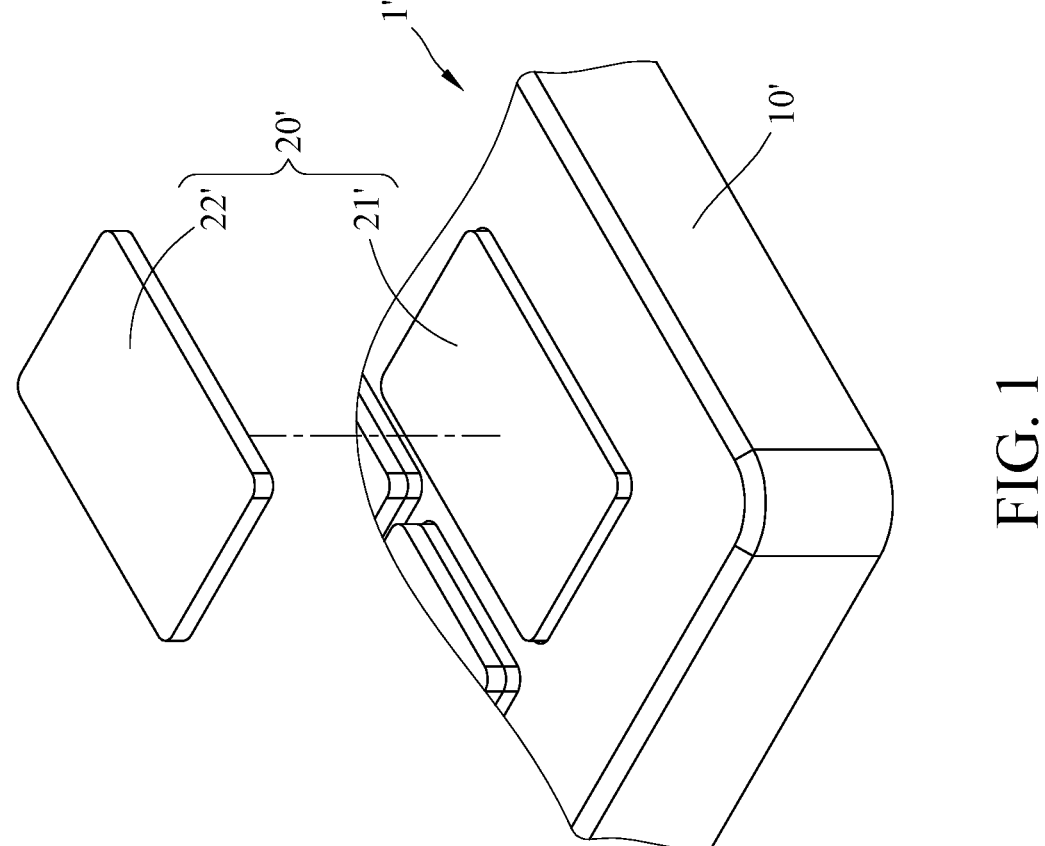
FIG. 1 is a partial exploded view of a keyboard according to the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

In addition, the terms used in the present disclosure, such as technical and scientific terms, have its own meanings and can be comprehended by those skilled in the art, unless the terms are additionally defined in the present disclosure. That is, the terms used in the following paragraphs should be read on the meaning commonly used in the related fields and will not be overly explained, unless the terms have a specific meaning in the present disclosure.

Referring to FIG. 1, FIG. 1 is a partial exploded view of a keyboard 1' according to the disclosure.

The disclosure provides a keyboard 1' including a casing 10' and at least one key module 20'. The key module 20' includes a key main body 21' and a digital display unit 22'. The key main body 21' is disposed on the casing 10'. The key main body 21' is, for example, a key structure, such as a mechanical-typed, film-typed or scissor-typed key. The digital display unit 22' is, for example, an OLED panel. The digital display unit 22' is disposed on the key main body 21' and is configured to display a digital image, such as a character or a pattern. The following paragraphs will specifically introduce each embodiment of the disclosure.

Figure 2:
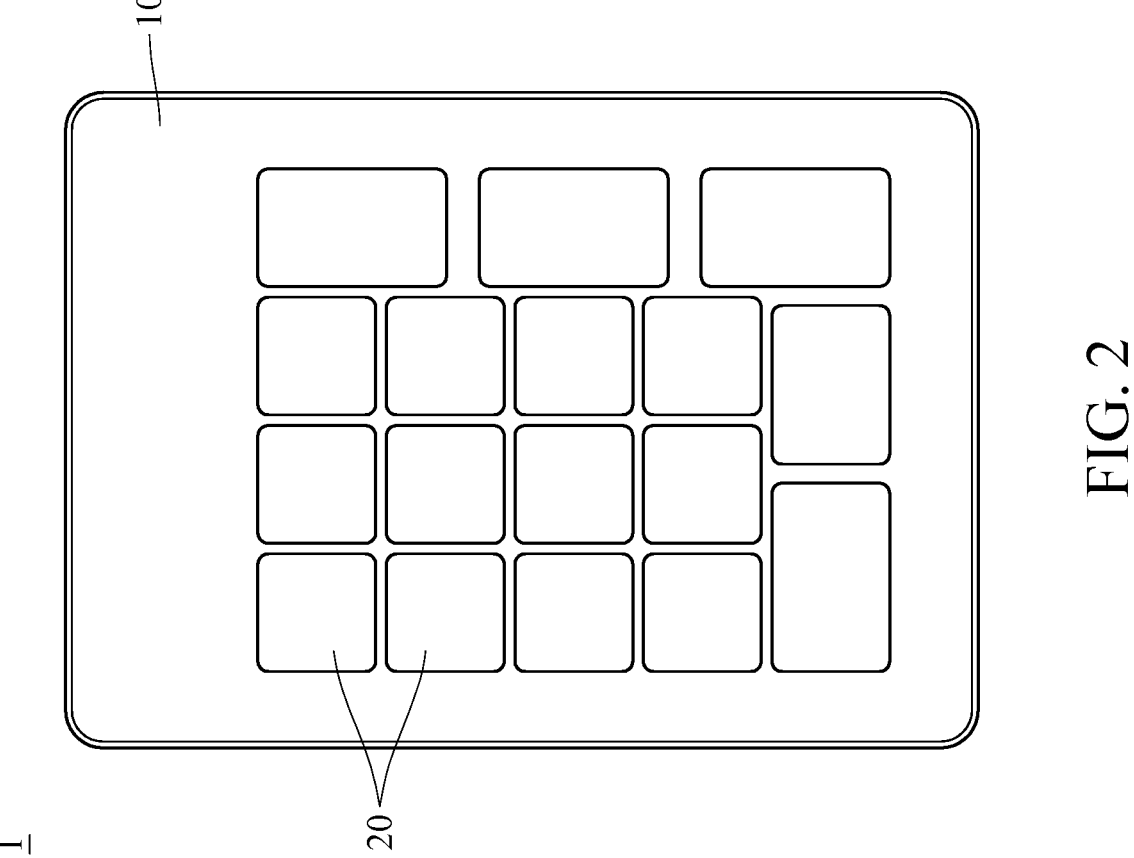
FIG. 2 is a schematic view of a keyboard according to a first embodiment of the disclosure.
Figure 3:
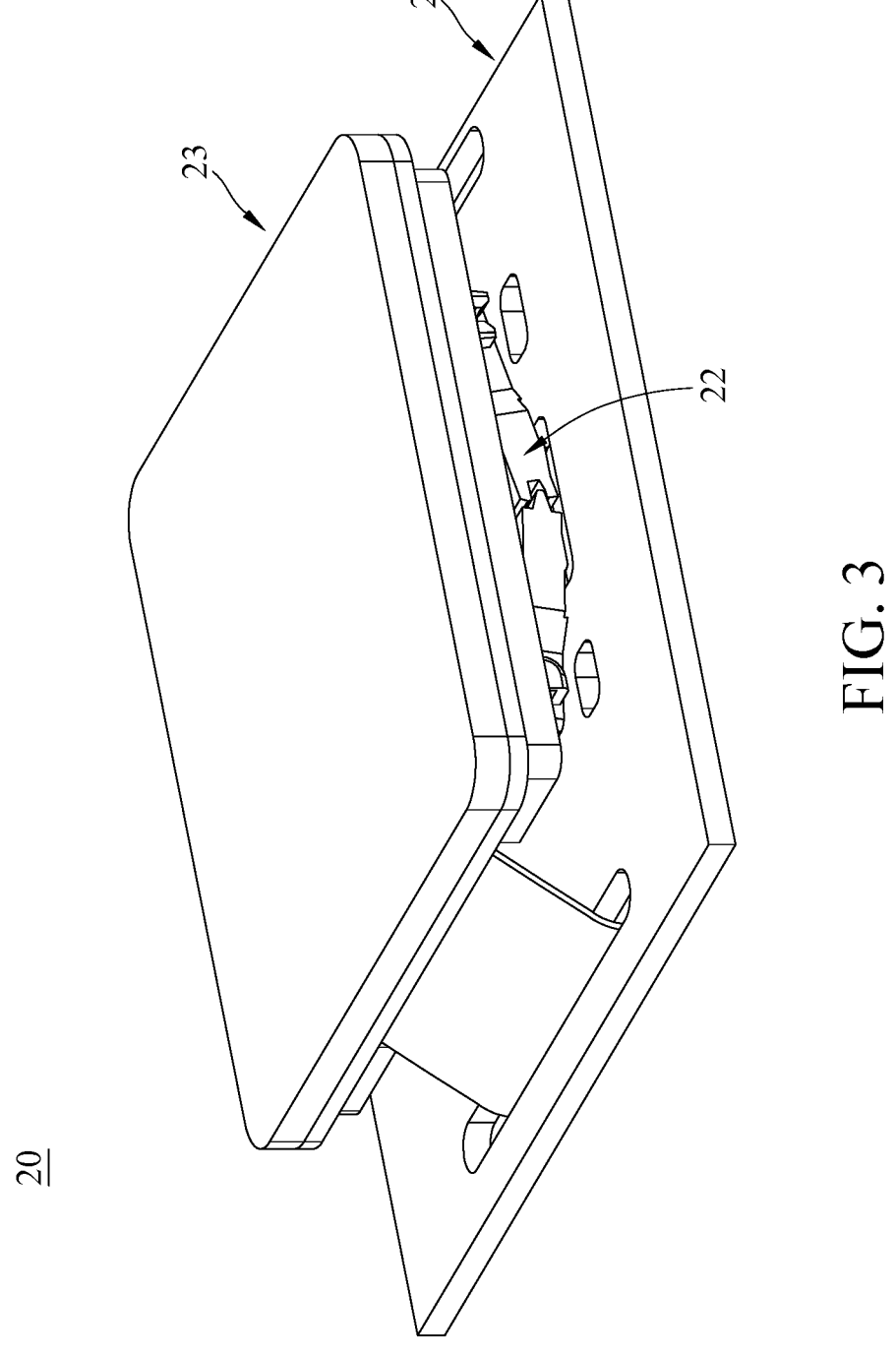
FIG. 3 is a perspective view of a key module of the keyboard in FIG. 2.

Referring to FIGS. 2 and 3, FIG. 2 is a schematic view of a keyboard 1 according to a first embodiment of the disclosure, and FIG. 3 is a perspective view of a key module 20 of the keyboard 1 in FIG. 2.

In this embodiment, the keyboard 1 is, for example, a computer keyboard for a desktop computer (not shown). The keyboard 1 includes a casing 10 and a plurality of key modules 20. The key modules 20 are movably disposed on the casing 10, and each of them includes a circuit assembly 21, a support assembly 22 and a display assembly 23.

Figure 4:
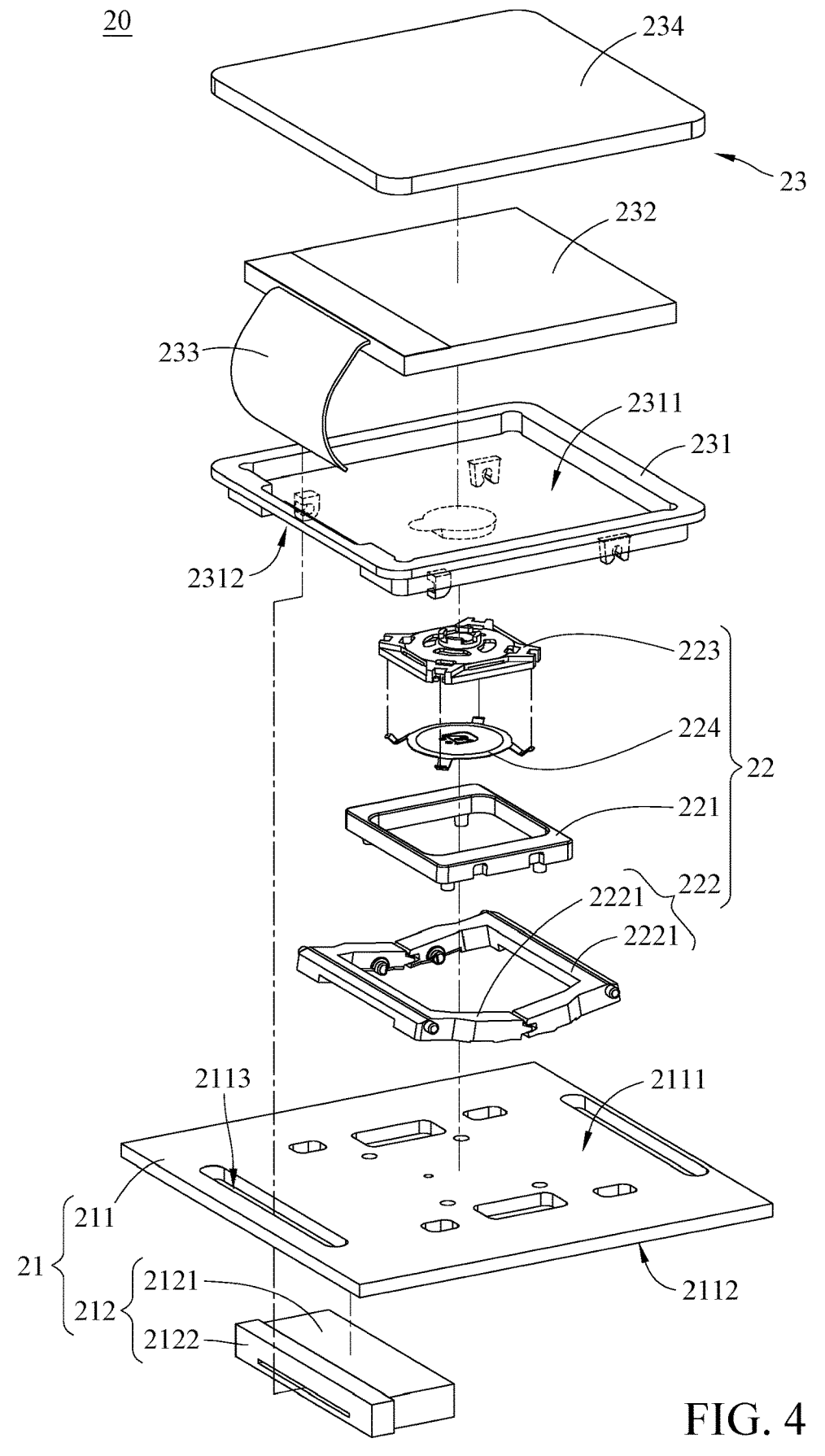
FIG. 4 is an exploded view of the key module in FIG. 3.
Figure 5:
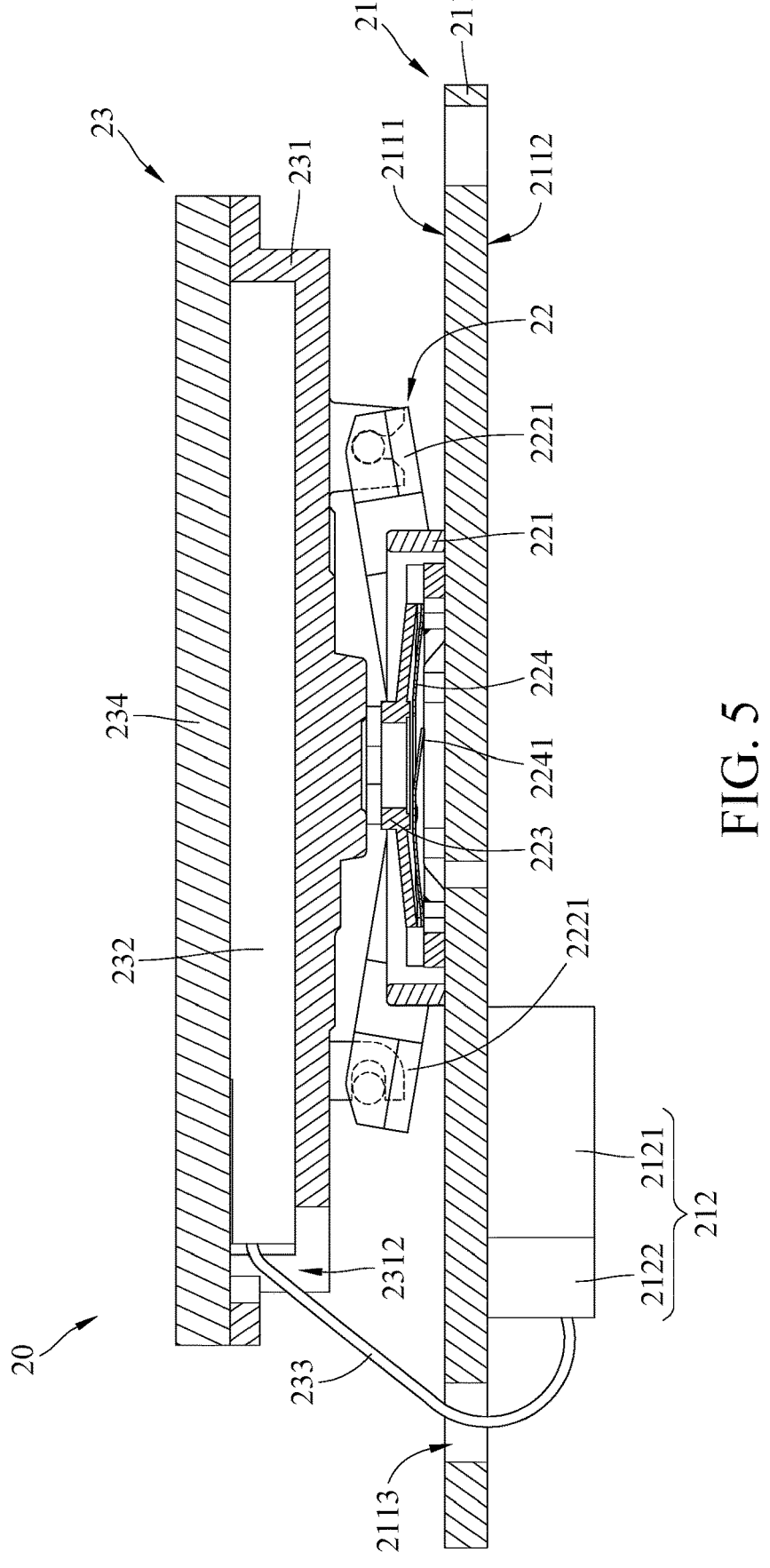
FIG. 5 is a cross-sectional view of the key module in FIG. 3.

In this embodiment, the key modules 20 are substantially the same in structure, and thus the following paragraphs will only introduce one of the key modules 20. Referring to FIGS. 4 and 5, FIG. 4 is an exploded view of the key module 20 in FIG. 3, and FIG. 5 is a cross-sectional view of the key module 20 in FIG. 3.

In this embodiment, the circuit assembly 21 may include a circuit board 211 and an electrical connector 212. The circuit board 211 has a first surface 2111, a second surface 2112 and a through hole 2113. The second surface 2112 is located opposite to the first surface 2111, and the through hole 2113 penetrates through the first surface 2111 and the second surface 2112. The electrical connector 212 includes a main body 2121 and a joint 2122 connected to each other. The main body 2121 of the electrical connector 212 is disposed on the second surface 2112 of the circuit board 211, and the joint 2122 is located closer to the through hole 2113 than the main body 2121.

The support assembly 22 is disposed on the first surface 2111 of the circuit board 211, and the support assembly 22 and the electrical connector 212 are located at the same side of the through hole 2113 of the circuit board 211; that is, the electrical connector 212 is located at one side of the through hole 2113 of the circuit board 211 located closer to the support assembly 22. In other words, the electrical connector 212 is located between the through hole 2113 and the support assembly 22. Specifically, the support assembly 22 may include a fixed base 221, a support frame 222, a flexible component 223 and a trigger component 224. The fixed base 221 is fixed on the first surface 2111 of the circuit board 211. The support frame 222 includes two movable parts 2221, and one side of each of the movable parts 2221 is pivotably disposed on the fixed base 221. The flexible component 223 is, for example, made of rubber material or silicone material. The flexible component 223 is disposed on the fixed base 221. The trigger component 224 is, for example, made of metal material. The trigger component 224 is disposed on the flexible component 223. The trigger component 224 has a trigger portion 2241. As shown in FIG. 5, in the case that the trigger component 224 is not pressed, the trigger portion 2241 of the trigger component 224 is spaced apart from the first surface 2111 of the circuit board 211 so as not to conduct a circuit of the circuit board 211.

The display assembly 23 includes a digital display unit 232, and the display assembly 23 may further include an accommodation component 231, a flexible electrical connection component 233 and a light permeable plate 234. Another side of each of the movable parts 2221 of the support frame 222 is pivotably disposed on the accommodation component 231, and the flexible component 223 is in contact with the accommodation component 231. In this embodiment, the key main body 21' consists of the accommodation component 231, the support assembly 22 and the circuit assembly 21, but the structure of the key main body 21' is not restricted thereto. The accommodation component 231 has an accommodation recess 2311 and an opening 2312 connected to the each other. The digital display unit 232 is, for example but not limited to, a OLED panel. The digital display unit 232 is configured to display a digital image, such as a character or a pattern, wherein the character may be an alphabet of any language, a word of any language, an Arabic number, a Mathematics symbol or a punctuation mark, and the pattern may be a pattern of an application (e.g., Word, Excel, Powerpoint, Facebook, Twitter, Youtube, etc.). The digital display unit 232 is accommodated in the accommodation recess 2311 of the accommodation component 231. The flexible electrical connection component 233 is, for example, a flexible wiring board or a flexible flat cable. One end of the flexible electrical connection component 233 is connected to the digital display unit 232, the flexible electrical connection component 233 is disposed through the opening 2312 of the accommodation component 231 and the through hole 2113 of the circuit board 211, and another end of the flexible electrical connection component 233 is connected to the joint 2122 of the electrical connector 212, so that the digital display unit 232 is electrically connected to the circuit board 211 via the flexible electrical connection component 233 and the electrical connector 212. As shown in FIG. 5, in the case that the key module 20 is not pressed, the flexible electrical connection component 233 is C-shaped. The light permeable plate 234 is mounted on the accommodation component 231, and the light permeable plate 234 covers the digital display unit 232.

Note that the accommodation recess 2311 and the opening 2312 of the accommodation component 231 are optional structures; in some other embodiments, the accommodation component may be a flat plate, and thus may not have any accommodation recess and opening.

In this embodiment, the keyboard 1 may further include a control unit, a wireless communication module, a connection port, a battery charging management module and a battery unit (those are not shown in the figures). The control unit is, for example, a microcontroller. The control unit is electrically connected to the circuit board 211, the wireless communication module, the connection port and the battery unit. The wireless communication module is, for example, a Bluetooth communication module, and the control unit may be in signal communication with a host of the desktop computer via the wireless communication module by a wireless manner. The connection port is, for example, a USB port, and a cable can be inserted into the connection port for electrically connecting the keyboard 1 with the host of the desktop computer, so that the control unit can be in signal communication with the host of the desktop computer via the connection port and the cable by a wire manner. The connection port is electrically connected to the battery unit via the battery charging management module. The connection port may be electrically connected to an external power supply via the cable, so that the external power supply can charge the battery unit. The battery unit is, for example, a lithium battery and can provide electricity for the operation of the keyboard 1.

Figure 6:
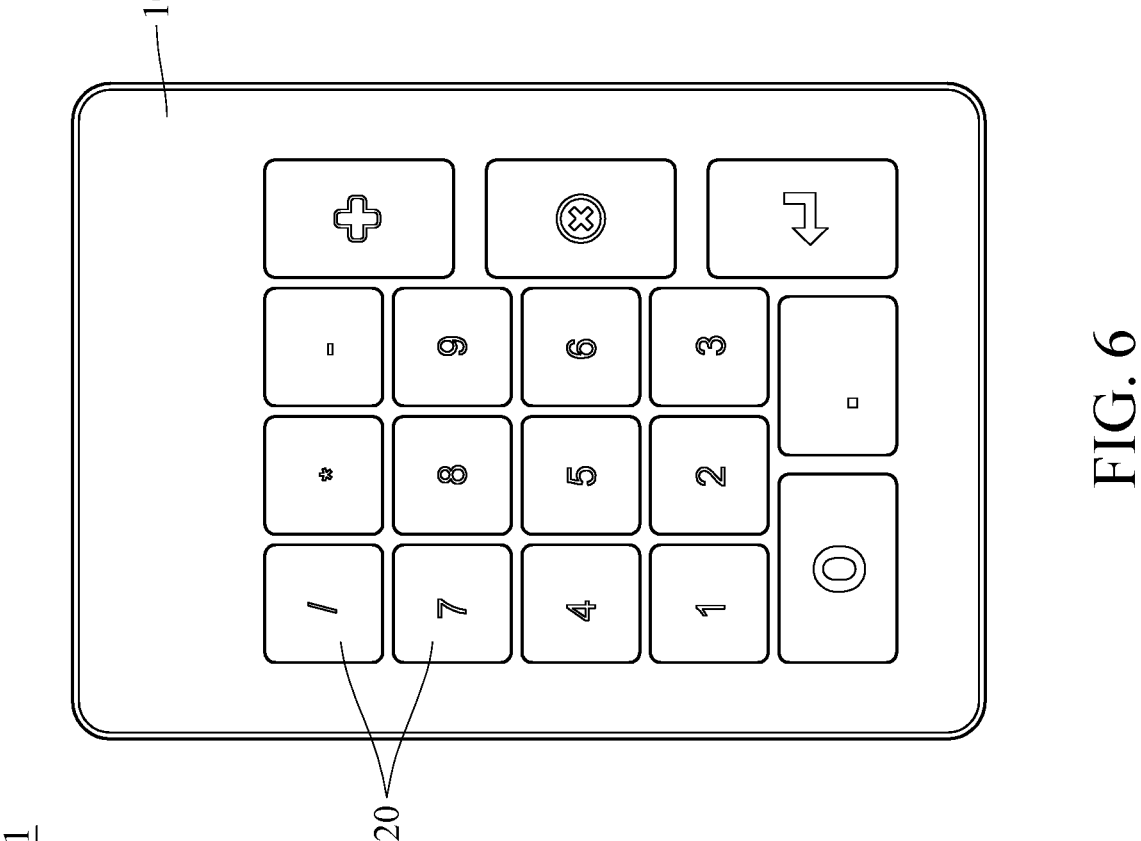
FIG. 6 is a schematic view of the keyboard in FIG. 2 when the keyboard is in a default state.
Figure 7:
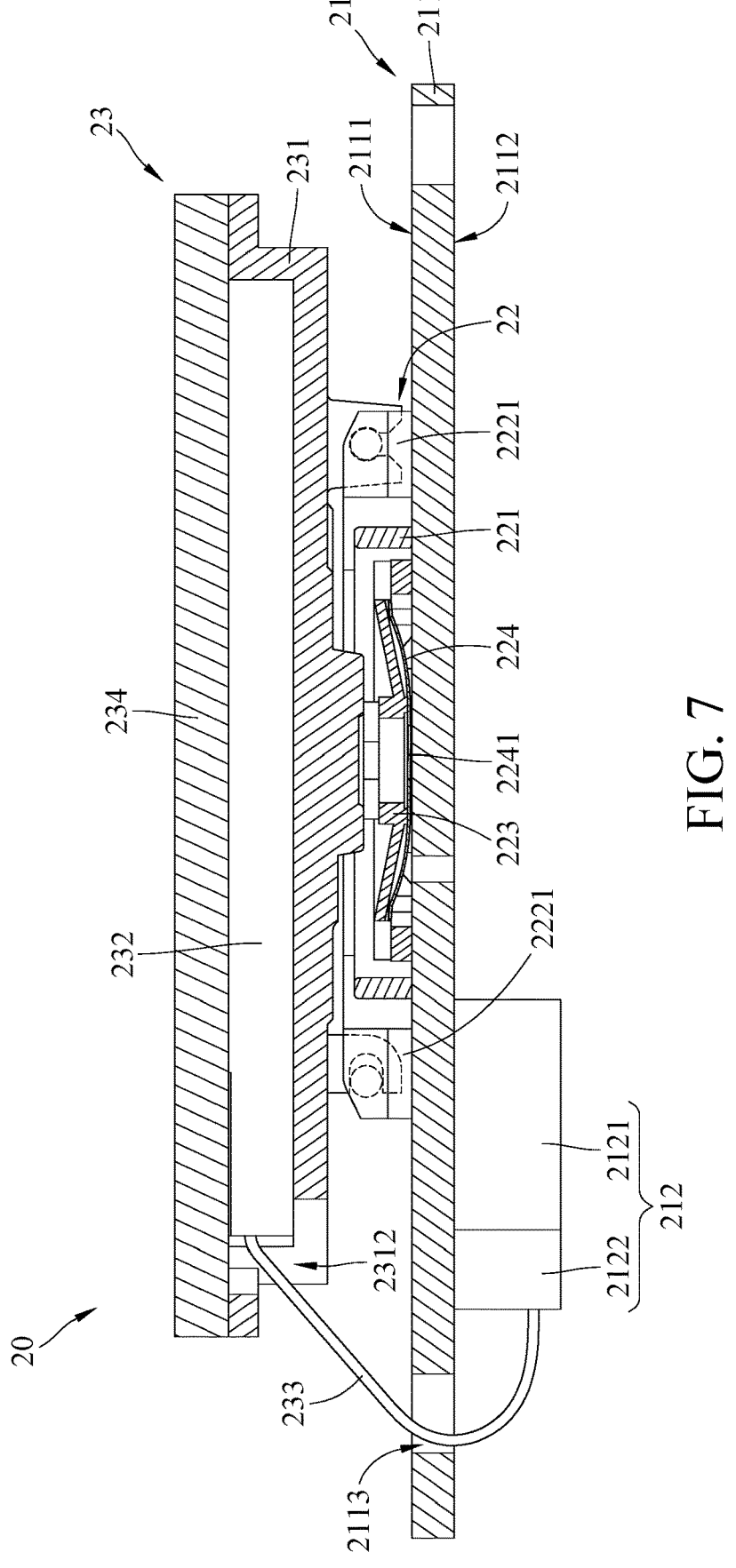
FIG. 7 is a cross-sectional view of the key module in FIG. 5 when the key module is pressed down.

Then, referring to FIGS. 6 and 7, FIG. 6 is a schematic view of the keyboard 1 in FIG. 2 when the keyboard 1 is in a default state, and FIG. 7 is a cross-sectional view of the key module 20 in FIG. 5 when the key module 20 is pressed down.

When the keyboard 1 is turned on, the keyboard 1 is initially in a default state, and the control unit may drive the digital display units 232 of the key modules 20 to respectively display characters via the circuit board 211, where the characters are, for example, "1 to 9", "+", "−", "*", "/" and so on. As shown in FIG. 7, when one of the key modules 20 (e.g., the key module 20 showing the character "1") is pressed, the accommodation component 231 are moved towards the first surface 2111 of the circuit board 211 so as to press against the flexible component 223, such that the flexible component 223 is forced to press against the trigger component 224, and thus the trigger portion 2241 of the trigger component 224 is in contact with the first surface 2111 of the circuit board 211. At this moment, the control unit drives the wireless communication module to transmit an activation signal of the key module 20 to the host of the desktop computer for indicating that the key module 20 is pressed.

As shown in FIG. 7, after the key module 20 is pressed, the C-shaped flexible electrical connection component 233 may be deformed along with the movement of the digital display unit 232. The deformed portion of the C-shaped flexible electrical connection component 233 is mainly located below a lower side of the circuit board 211 (e.g., one side of the circuit board 211 where the second surface 2112 faces), and there is a space below the lower side of the circuit board 211 for enabling the deformation of the flexible electrical connection component 233. Therefore, the C-shaped flexible electrical connection component 233 can prevent the key module 20 from being stuck and ensure the tactile feedback of the key module 20.

Figure 8:
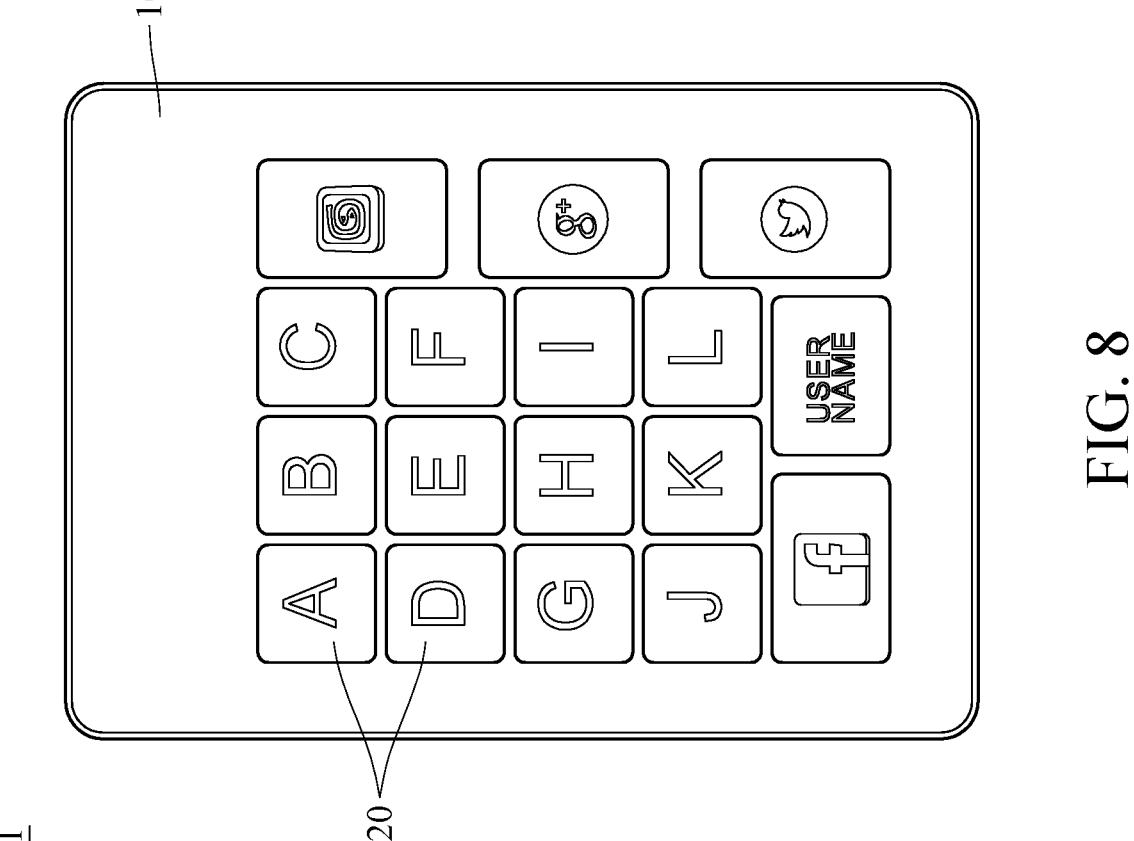
FIG. 8 is a schematic view of the keyboard in FIG. 2 when characters displayed by the keyboard are switched.

In this embodiment, the keyboard 1 may be switched from the default state to a switched state according to requirements for switching the characters displayed by the digital display units 232 of the key modules 20 of the keyboard 1 to others. Referring to FIG. 8, FIG. 8 is a schematic view of the keyboard 1 in FIG. 2 when characters displayed by the keyboard 1 are switched. For example, two of the key modules 20 (e.g., the key modules 20 showing "/" and "*") can be pressed simultaneously. After the control unit receives that the circuits corresponding to the two key modules 20 are conducted, the control unit drives all of the digital display units 232 of the key modules 20 to switch the characters or the patterns to others, and the functions of all of the key modules 20 are changed correspondingly. As shown in FIG. 8, the digital display units 232 of the key modules 20 respectively display the characters "A to L" and the patterns of Facebook, Twitter and so on.

Note that the characters displayed by the digital display units 232 of the key modules 20 of the keyboard 1 are not restricted to being switched by pressing two of the key modules 20 simultaneously. How to switch the characters displayed by the digital display units 232 of the key modules 20 of the keyboard 1 to other may be defined according to actual requirements, such as double pressing one of the key modules 20 or pressing one of the key modules 20 for at least one second.

On the other hand, when the keyboard 1 is in the default state or the switched state, the characters displayed by the key modules 20 are not restricted in the disclosure and may be modified according to actual requirements.

In this embodiment, each of the key modules 20 includes the digital display unit 232 for displaying the digital image, so that the key modules 20 may display characters from different languages according to actual requirements, and thus the key modules 20 may be applied in the keyboard 1 of different languages, thereby reducing the cost of the production and maintenance of the keyboard 1. In addition, the characters displayed by the digital display units 232 of the key modules 20 of the keyboard 1 can be switched according to actual requirements, and thus the arrangement of the characters of the keyboard 1 can be adjusted.

In this embodiment, the light permeable plate 234 not only enables the character displayed by the digital display unit 232 to be viewed, but also protects the digital display unit 232. Note that the light permeable plate 234 is an optional component. When the digital display unit has a sufficient structural strength to resist the pressing of a user, the display assembly may not have the light permeable plate. In addition, the accommodation component 231 of the display assembly 23 is an optional component; in some other embodiments, the display assembly may not have the accommodation component, and a rear side of the digital display unit may be additionally provided with a structure for being coupled with the movable parts of the support frame.

On the other hand, the support assembly 22 is not restricted to including the fixed base 221, the support frame 222, the flexible component 223 and the trigger component 224. As long as the display assembly is supported on the circuit board, and the display assembly can be moved relative to the circuit board back and forth, the support assembly may be another type of the structure.

In this embodiment, the through hole 2113 of the circuit board 211 is an optional structure; in some other embodiments, the circuit board may not have the through hole, and the flexible electrical connection component may be bent and pass through a side edge of the circuit board to be connected to the electrical connector located at the second surface of the circuit board, or the electrical connector may be disposed on the first surface of the circuit board. In addition, the electrical connector 212 is an optional component; in some other embodiments, the circuit assembly may not have the electrical connector, and the flexible electrical connection component may be directly welded on the first surface of the circuit board so as to be electrically connected to the circuit board.

In this embodiment, the keyboard 1 is not restricted to being for the desktop computer; in some other embodiments, the keyboard may be for a laptop computer. Alternatively, in another embodiment, the keyboard may be a keyboard of the laptop computer or the desktop computer; that is, the keyboard may not be a numeric keyboard shown in FIG. 6, and may be a standard keyboard of the laptop computer or the desktop computer; in other words, the keyboard may have complete key modules, such as alphabet key modules, function key modules and number key modules.

Figure 9:
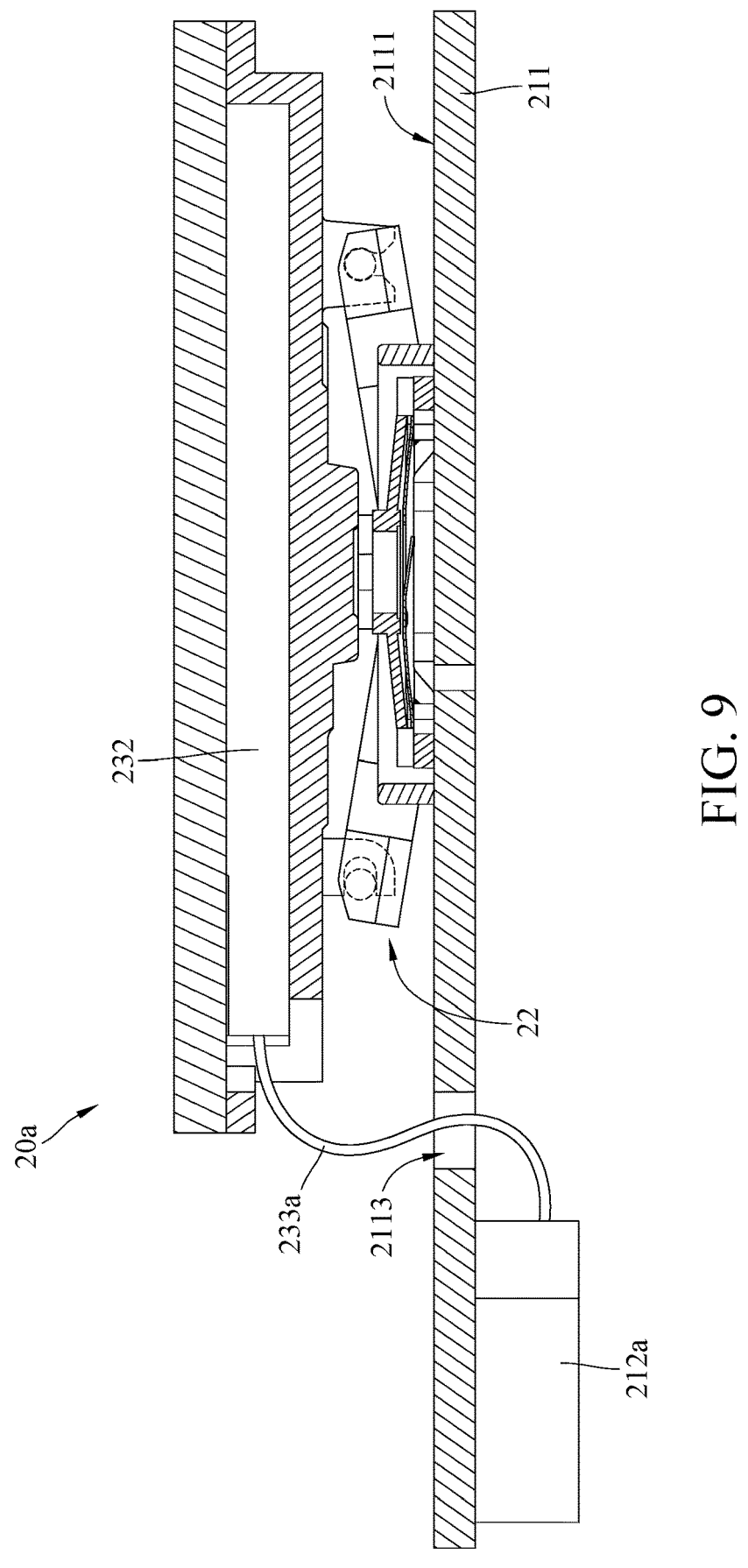
FIG. 9 is a cross-sectional view of a key module according to a second embodiment of the disclosure.

Then, referring to FIG. 9, FIG. 9 is a cross-sectional view of a key module 20a according to a second embodiment of the disclosure.

The key module 20a of this embodiment is similar to the key module 20 with reference to FIGS. 3 to 5, and the main difference between them is the position of the electrical connector. Therefore, the following paragraph merely introduces the difference between them, and the same parts can be referred to the paragraphs with reference to FIGS. 3 to 5 and will not be repeatedly introduced hereinafter.

In this embodiment, an electrical connector 212a and the support assembly 22 are respectively located on two opposite sides of the through hole 2113 of the circuit board 211; that is, the electrical connector 212a is located on one side of the through hole 2113 located farther away from the support assembly 22; in other words, the through hole 2113 is located between the electrical connector 212a and the support assembly 22. A flexible electrical connection component 233a connected to the digital display unit 232 and the electrical connector 212a is S-shaped. After the key module 20a is pressed, a deformed portion of the S-shaped flexible electrical connection component 233a is mainly located above an upper side of the circuit board 211 (e.g., one side of the circuit board 211 where the first surface 2111 faces), and there is a space above the upper side of the circuit board 211 for enabling the deformation of the flexible electrical connection component 233a. Therefore, the S-shaped flexible electrical connection component 233a can prevent the key module 20a from being stuck and ensure the tactile feedback of the key module 20a.

Figure 10:
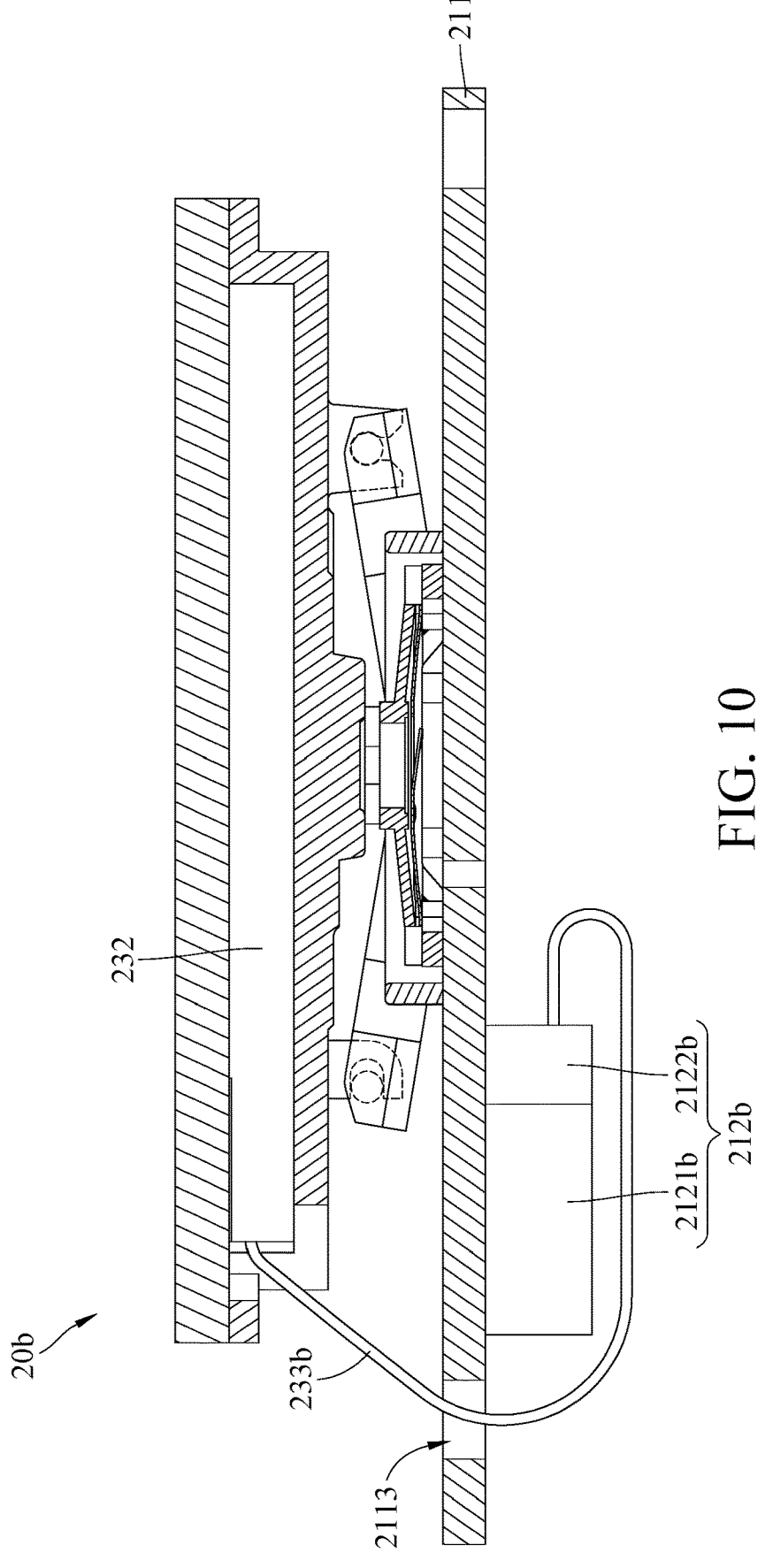
FIG. 10 is a cross-sectional view of a key module according to a third embodiment of the disclosure.

Then, referring to FIG. 10, FIG. 10 is a cross-sectional view of a key module 20b according to a third embodiment of the disclosure.

The key module 20b of this embodiment is similar to the key module 20 with reference to FIGS. 3 to 5, and the main difference between them is the placement direction of the electrical connector. Therefore, the following paragraph merely introduces the difference between them, and the same parts can be referred to the paragraphs with reference to FIGS. 3 to 5 and will not be repeatedly introduced hereinafter.

In this embodiment, a joint 2122b of an electrical connector 212b is located farther away from the through hole 2113 of the circuit board 211 than a main body 2121b of the electrical connector 212b, and a flexible electrical connection component 233b connected to the digital display unit 232 and the electrical connector 212b is G-shaped. After the key module 20b is pressed, a deformed portion of the G-shaped flexible electrical connection component 233b is mainly located near the joint 2122b of the electrical connector 212b, and there is a space near the joint 2122b of the electrical connector 212b for enabling the deformation of the flexible electrical connection component 233b. Therefore, the G-shaped flexible electrical connection component 233b can prevent the key module 20b from being stuck and ensure the tactile feedback of the key module 20b.

Figure 11:
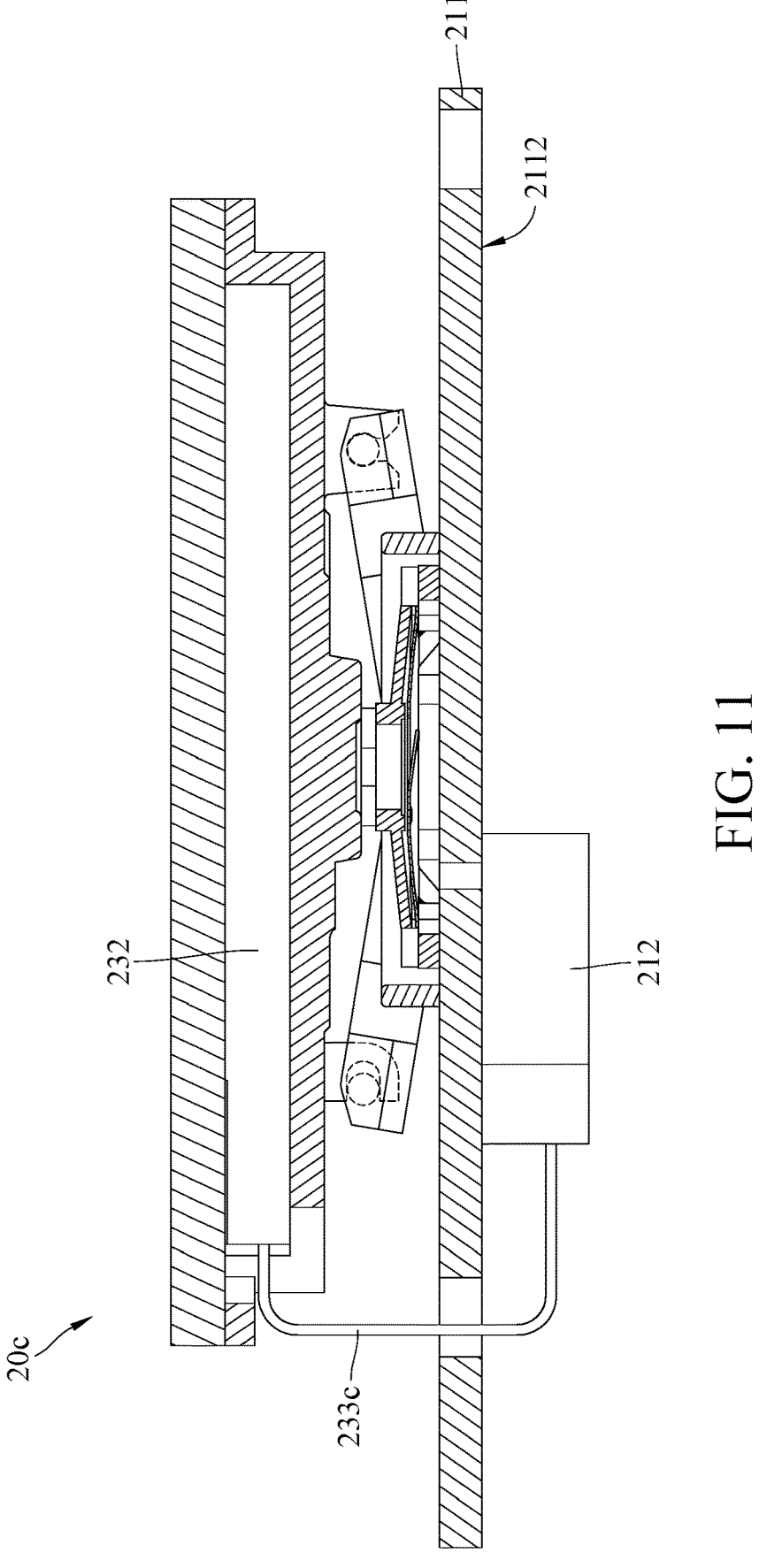
FIG. 11 is a cross-sectional view of a key module according to a fourth embodiment of the disclosure.

Then, referring to FIG. 11, FIG. 11 is a cross-sectional view of a key module 20c according to a fourth embodiment of the disclosure.

The key module 20c of this embodiment is similar to the key module 20 with reference to FIGS. 3 to 5, and the main difference between them is the shape of the flexible electrical connection component. Therefore, the following paragraph merely introduces the difference between them, and the same parts can be referred to the paragraphs with reference to FIGS. 3 to 5 and will not be repeatedly introduced hereinafter.

In this embodiment, a flexible electrical connection component 233c connected to the digital display unit 232 and the electrical connector 212 is U-shaped. After the key module 20c is pressed, a deformed portion of the U-shaped flexible electrical connection component 233c is mainly located below a lower side of the circuit board 211 (e.g., one side of the circuit board 211 where the second surface 2112 faces), and there is a space below the lower side of the circuit board 211 for enabling the deformation of the flexible electrical connection component 233c. Therefore, the U-shaped flexible electrical connection component 233c can prevent the key module 20c from being stuck and ensure the tactile feedback of the key module 20c.

According to the key modules and the keyboards as discussed in the above embodiments, each of the key modules includes the digital display unit for displaying the digital image, so that the key modules may display characters of different languages according to actual requirements, and thus the key modules may be applied in the keyboard of different languages, thereby reducing the cost of the production and maintenance of the keyboard. In addition, the characters displayed by the digital display units of the key modules of the keyboard can be switched according to actual requirements, and thus the arrangement of the characters of the keyboard can be adjusted.

It will be apparent to those skilled in the art that various modifications and variations can be made to the present disclosure. It is intended that the specification and examples be considered as exemplary embodiments only, with a scope of the disclosure being indicated by the following claims and their equivalents.

What is claimed is:

1. A key module, comprising:
   a circuit assembly;
   a support assembly, movably disposed on the circuit assembly; and
   a display assembly, comprising a digital display unit, wherein the digital display unit is supported on the circuit assembly by the support assembly, and the digital display unit is electrically connected to the circuit assembly;
   wherein the display assembly further comprises a flexible electrical connection component, and the digital display unit is electrically connected to the circuit assembly via the flexible electrical connection component;
   wherein the circuit assembly comprises a circuit board and an electrical connector, the circuit board has a first surface and a second surface, the second surface is located opposite to the first surface, the support assembly is movably disposed on the first surface of the circuit board, the electrical connector is disposed on the second surface of the circuit board, and the digital display unit is electrically connected to the circuit board via the flexible electrical connection component and the electrical connector;
   wherein the circuit board further has a through hole, the through hole penetrates through the first surface and the second surface, the electrical connector is located between the through hole and the support assembly, and the flexible electrical connection component is disposed through the through hole, wherein the flexible electrical connection component and the electrical connector are on a same side adjacent the support assembly.

2. The key module according to claim 1, wherein the electrical connector comprises a main body and a joint connected to each other, the main body is disposed on the second surface of the circuit board, the joint is located closer to the through hole than the main body, and the flexible electrical connection component is connected to the joint.

3. The key module according to claim 1, wherein the flexible electrical connection component is C-shaped, G-shaped or U-shaped.

4. The key module according to claim 1, wherein the display assembly further comprises an accommodation component, the accommodation component is disposed on the support assembly, and the digital display unit is accommodated in the accommodation component.

5. The key module according to claim 4, wherein the display assembly further comprises a light permeable plate, the light permeable plate is mounted on the accommodation component and covers the digital display unit.

6. The key module according to claim 4, wherein the support assembly comprises a fixed base, a support frame, a flexible component and a trigger component, the fixed base is fixed on the circuit assembly, the support frame comprises two movable parts, two sides of each of the two movable parts are pivotably disposed on the fixed base and the accommodation component respectively, the flexible component is disposed in the fixed base and is in contact with the accommodation component, and the trigger component is disposed on the flexible component.

7. A keyboard, comprising:
a casing; and
a plurality of key modules, disposed on the casing, wherein each of the plurality of key modules comprises:
a circuit assembly;
a support assembly, movably disposed on the circuit assembly; and
a display assembly, comprising a digital display unit, wherein the digital display unit is supported on the circuit assembly by the support assembly, and the digital display unit is electrically connected to the circuit assembly;
wherein the display assembly further comprises a flexible electrical connection component, and the digital display unit is electrically connected to the circuit assembly via the flexible electrical connection component;
wherein the circuit assembly comprises a circuit board and an electrical connector, the circuit board has a first surface and a second surface, the second surface is located opposite to the first surface, the support assembly is movably disposed on the first surface of the circuit board, the electrical connector is disposed on the second surface of the circuit board, and the digital display unit is electrically connected to the circuit board via the flexible electrical connection component and the electrical connector;

wherein the circuit board further has a through hole, the through hole penetrates through the first surface and the second surface, the electrical connector is located between the through hole and the support assembly, and the flexible electrical connection component is disposed through the through hole, wherein the flexible electrical connection component and the electrical connector are on a same side adjacent the support assembly.

8. The keyboard according to claim 7, wherein the electrical connector comprises a main body and a joint connected to each other, the main body is disposed on the second surface of the circuit board, the joint is located closer to the through hole than the main body, and the flexible electrical connection component is connected to the joint.

9. The keyboard according to claim 7, wherein the flexible electrical connection component is C-shaped, G-shaped or U-shaped.

10. The keyboard according to claim 7, wherein the display assembly further comprises an accommodation component, the accommodation component is disposed on the support assembly, and the digital display unit is accommodated in the accommodation component.

11. The keyboard according to claim 10, wherein the display assembly further comprises a light permeable plate, the light permeable plate is mounted on the accommodation component and covers the digital display unit.

12. The keyboard according to claim 10, wherein the support assembly comprises a fixed base, a support frame, a flexible component and a trigger component, the fixed base is fixed on the circuit assembly, the support frame comprises two movable parts, two sides of each of the two movable parts are pivotably disposed on the fixed base and the accommodation component respectively, the flexible component is disposed in the fixed base and is in contact with the accommodation component, and the trigger component is disposed on the flexible component.

13. The keyboard according to claim 12, wherein the display assembly further comprises a light permeable plate, the light permeable plate is mounted on the accommodation component and covers the digital display unit.

* * * * *